(12) United States Patent
Chen et al.

(10) Patent No.: US 11,000,782 B2
(45) Date of Patent: May 11, 2021

(54) METHOD AND APPARATUS FOR CLEANING SUBSTRATES USING HIGH TEMPERATURE CHEMICALS AND ULTRASONIC DEVICE

(71) Applicant: ACM Research (Shanghai) Inc., Shanghai (CN)

(72) Inventors: Fuping Chen, Shanghai (CN); Hui Wang, Shanghai (CN); Xi Wang, Shanghai (CN); Shena Jia, Shanghai (CN); Danying Wang, Shanghai (CN); Chaowei Jiang, Shanghai (CN); Yingwei Dai, Shanghai (CN); Jian Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 228 days.

(21) Appl. No.: 15/781,884

(22) PCT Filed: Dec. 9, 2015

(86) PCT No.: PCT/CN2015/096788
§ 371 (c)(1),
(2) Date: Jun. 6, 2018

(87) PCT Pub. No.: WO2017/096553
PCT Pub. Date: Jun. 15, 2017

(65) Prior Publication Data
US 2018/0353876 A1 Dec. 13, 2018

(51) Int. Cl.
*B08B 3/12* (2006.01)
*H01L 21/02* (2006.01)
(Continued)

(52) U.S. Cl.
CPC ......... *B01D 19/0036* (2013.01); *B01D 19/00* (2013.01); *B08B 3/041* (2013.01);
(Continued)

(58) Field of Classification Search
None
See application file for complete search history.

(56) References Cited

U.S. PATENT DOCUMENTS 4,864,547 A * 9/1989 Krsna ................... B06B 1/0223
                                                        367/137
5,061,156 A 10/1991 Kuehne et al.
(Continued)

FOREIGN PATENT DOCUMENTS

CN 1509199 A 6/2004
CN 101223482 A 7/2008
(Continued)

OTHER PUBLICATIONS

Kern, Handbook of Semiconductor Wafer Cleaning Technology, 1993, Noyes Publications, pp. 127-128.*
(Continued)

*Primary Examiner* — Nicole Blan
(74) *Attorney, Agent, or Firm* — Osha Bergman Watanabe & Burton LLP

(57) ABSTRACT

The present invention provides a high temperature chemical solution supply system for cleaning substrates. The system includes a solution tank, a buffer tank, a first pump and a second pump. The solution tank contains high temperature chemical solution. The buffer tank has a tank body, a vent line and a needle valve. The tank body contains the high temperature chemical solution. An end of the vent line connects to the tank body, and the other end of the vent line connects to the solution tank. The needle valve is mounted on the vent line, wherein the needle valve is adjusted to
(Continued)

reach a flow rate to vent gas bubbles inside of the high temperature chemical solution out of the buffer tank through the vent line. An inlet of the first pump connects to the solution tank, and an outlet of the first pump connects to the buffer tank. An inlet of the second pump connects to the buffer tank, and an outlet of the second pump connects to a cleaning chamber in which a substrate is cleaned. The present invention also provides an apparatus including the high temperature chemical solution supply system and an ultra or mega sonic device for cleaning the substrate. The present invention also provides methods for cleaning the substrates.

5 Claims, 8 Drawing Sheets

(51) Int. Cl.

| | | |
|---|---|---|
| *B08B 3/04* | (2006.01) | |
| *B08B 3/08* | (2006.01) | |
| *B08B 3/10* | (2006.01) | |
| *B01D 19/00* | (2006.01) | |
| *F04B 15/04* | (2006.01) | |
| *H01L 21/67* | (2006.01) | |
| *F04B 23/00* | (2006.01) | |
| *B08B 7/02* | (2006.01) | |
| *B08B 7/04* | (2006.01) | |
| *F04B 23/04* | (2006.01) | |

(52) U.S. Cl.
CPC .................. *B08B 3/08* (2013.01); *B08B 3/10* (2013.01); *B08B 3/12* (2013.01); *B08B 7/028* (2013.01); *B08B 7/04* (2013.01); *F04B 15/04* (2013.01); *F04B 23/00* (2013.01); *H01L 21/02052* (2013.01); *H01L 21/02057* (2013.01); *H01L 21/67017* (2013.01); *H01L 21/67051* (2013.01); *H01L 21/67092* (2013.01); *H01L 21/67253* (2013.01); *B08B 2203/007* (2013.01); *B08B 2203/027* (2013.01); *F04B 23/04* (2013.01)

(56) References Cited

U.S. PATENT DOCUMENTS

| | | | |
|---|---|---|---|
| 7,381,269 B2 | 6/2008 | Kang et al. | |
| 7,594,801 B2 | 9/2009 | Udagawa | |
| 2004/0000322 A1* | 1/2004 | Verhaverbeke | B08B 3/12 134/1.3 |
| 2004/0144736 A1 | 7/2004 | Yajima | |
| 2009/0286178 A1 | 11/2009 | Muroi et al. | |
| 2011/0155169 A1* | 6/2011 | Holsteyns | B08B 3/12 134/1.3 |
| 2011/0290277 A1* | 12/2011 | Wang | H01L 21/02063 134/1.3 |
| 2014/0224281 A1* | 8/2014 | Zhang | H01L 21/67023 134/30 |

FOREIGN PATENT DOCUMENTS

| | | |
|---|---|---|
| CN | 101465273 A | 6/2009 |
| CN | 101879511 A | 11/2010 |
| JP | 2001170539 A | 6/2001 |
| JP | 2005286054 A | 10/2005 |
| JP | 2011210933 A | 10/2011 |
| JP | 2013207076 A | 10/2013 |
| JP | 2015073007 A | 4/2015 |
| WO | 2007/085688 A1 | 8/2007 |

OTHER PUBLICATIONS

First Office Action dated Jan. 3, 2020, in corresponding Chinese Patent Application No. CN-201580085060.0 (18 pages), with Global Dossier English translation (21 pages).
Office Aciton issued in corresponding Japanese Application No. 2018-529555 dated Sep. 17, 2019 (5 pages).
International Search Report issued in PCT/CN2015/096788 dated Sep. 14, 2016 (2 pages).
Written Opinion of the International Searching Authority issued in PCT/CN2015/096788 dated Sep. 14, 2016 (5 pages).

* cited by examiner

METHOD AND APPARATUS FOR CLEANING SUBSTRATES USING HIGH TEMPERATURE CHEMICALS AND ULTRASONIC DEVICE

FIELD OF THE INVENTION

The present invention generally relates to a method and an apparatus for cleaning substrates, and more particularly relates to reducing gas bubbles inside of high temperature chemical solutions such as SC1 and gas bubbles generated or coalesced during cleaning process when supplying the high temperature chemical solutions into a single substrate cleaner having an ultrasonic device for cleaning a substrate.

BACKGROUND

During the process of manufacturing semiconductor devices, particles on a surface of a substrate need to be removed or cleaned prior to going to the next step process. Slurries and residues left on the surface of substrate such as post CMP (chemical-mechanical planarization) are difficult to remove. High temperature sulfuric acid (SPM) is being used for removing those particles. However the sulfuric acid is not only hard to safety handle but also the waste treatment of sulfuric acid is costly. Hot SC1 (containing hydrogen peroxide, ammonia hydroxide, and water) is very good candidate to replace the hot sulfuric acid. But the temperature of SC1 needs to be heated to more than 80° C. in order to effectively remove those particles.

When the SC1 being in such high temperature, chemicals $H_2O_2$ and $NH_4OH$ in SC1 are easily to be dissociated as gas bubbles of oxygen and ammonia gas if the SC1 chemical passes through low pressure suction, mechanical agitation, and heating processes. Those SC1 mixing with bubbles will cause miss function of pump, of heater, of flow meter and ultrasonic device during cleaning process.

Therefore, it needs to have a better method for controlling gas bubbles inside of hot chemical solutions during blending, heating, delivering and finally cleaning process when applying ultrasonic energy on substrate simultaneously.

SUMMARY

The present invention provides a high temperature chemical solution supply system for cleaning substrates. The system includes a solution tank, a buffer tank, a first pump and a second pump. The solution tank contains high temperature chemical solution. The buffer tank has a tank body, a vent line and a needle valve. The tank body contains the high temperature chemical solution. An end of the vent line connects to the tank body, and the other end of the vent line connects to the solution tank. The needle valve is mounted on the vent line, wherein the needle valve is adjusted to reach a flow rate to vent gas bubbles inside of the high temperature chemical solution out of the buffer tank through the vent line. An inlet of the first pump connects to the solution tank, and an outlet of the first pump connects to the buffer tank. An inlet of the second pump connects to the buffer tank, and an outlet of the second pump connects to a cleaning chamber in which a substrate is cleaned.

The present invention also provides an apparatus for cleaning substrates. The apparatus includes a solution tank, a buffer tank, a first pump, a second pump, a substrate chuck, a rotation driving mechanism, a nozzle, an ultra/mega sonic device and a vertical actuator. The solution tank contains high temperature chemical solution. The buffer tank has a tank body, a vent line and a needle valve. The tank body contains the high temperature chemical solution. An end of the vent line connects to the tank body, and the other end of the vent line connects to the solution tank. The needle valve is mounted on the vent line, wherein the needle valve is adjusted to reach a flow rate to vent gas bubbles inside of the high temperature chemical solution out of the buffer tank through the vent line. An inlet of the first pump connects to the solution tank, and an outlet of the first pump connects to the buffer tank. An inlet of the second pump connects to the buffer tank, and an outlet of the second pump connects to a cleaning chamber in which a substrate is cleaned. The substrate chuck holds the substrate. The rotation driving mechanism connects to the substrate chuck and drives the substrate chuck to rotate. The nozzle delivers the high temperature chemical solution or de-ionized water on the surface of the substrate. The ultra/mega sonic device is positioned adjacent to the substrate and a gap is formed between the substrate and the ultra/mega sonic device. The vertical actuator drives the ultra/mega sonic device to move up or down for changing the gap between the substrate and the ultra/mega sonic device.

The present invention provides a method for cleaning substrates, comprising: rotating a substrate; delivering deionized water on a surface of the substrate for pre wetting the surface of the substrate; delivering chemical solution with high temperature on the surface of the substrate for cleaning the surface of the substrate; changing the rotation speed of the substrate to a low rotation speed, and moving a ultra/mega sonic device close to the surface of the substrate with a gap d between the ultra/mega sonic device and the surface of the substrate, wherein the high temperature chemical solution is fully filled in the gap d; turning on the ultra/mega sonic device and supplying a constant or pulse working power in a first cleaning cycle; turning off the ultra/mega sonic device, and delivering a high temperature chemical solution or deionized wafer on the surface of the substrate for releasing bubbles generated by the ultra/mega sonic device, so as to prevent the bubbles from coalescing on the surface of the substrate; turning on the ultra/mega sonic device and supplying a constant or pulse working power in a second cleaning cycle; turning off the ultra/mega sonic device, and delivering rinse chemical solution or deionized water on the surface of the substrate; drying the substrate.

The present invention provides a method for cleaning substrates, comprising: rotating a substrate; delivering deionized water on a surface of the substrate for pre wetting the surface of the substrate; delivering chemical solution with high temperature on the surface of the substrate for cleaning the surface of the substrate; changing the rotation speed of the substrate to a low rotation speed, and moving a ultra/mega sonic device close to the surface of the substrate with a gap d between the ultra/mega sonic device and the surface of the substrate, wherein the high temperature chemical solution is fully filled in the gap d; turning on the ultra/mega sonic device and supplying a constant or pulse working power in a first cleaning cycle; turning off the ultra/mega sonic device, and raising up the ultra/mega sonic device out of the high temperature chemical solution surface for releasing bubbles coalesced under or around the ultra/mega sonic device; moving the ultra/mega sonic device down with a gap d between the ultra/mega sonic device and the surface of the substrate, and then turning on the ultra/mega sonic device and supplying a constant or pulse working power in a second cleaning cycle; turning off the ultra/mega sonic device, and delivering rinse chemical solution or deionized water on the surface of the substrate; drying the substrate.

The present invention provides a method for cleaning substrates, comprising: rotating a substrate; delivering deionized water on a surface of the substrate for pre wetting the surface of the substrate; delivering one type of high temperature chemical solution or deionized water on the surface of the substrate for cleaning the surface of the substrate; delivering one type of medium temperature chemical solution or deionized water on the surface of the substrate for cleaning the surface of the substrate; changing the rotation speed of the substrate to a low rotation speed, and moving a ultra/mega sonic device close to the surface of the substrate with a gap d between the ultra/mega sonic device and the surface of the substrate, co-working with the medium temperature chemical solution, wherein the cleaning chemical solution is fully filled in the gap d; turning on the ultra/mega sonic device and supplying a constant or pulse working power in a first cleaning cycle; delivering a medium temperature chemical solution or deionized water on the surface of the substrate for releasing bubbles generated by the medium temperature chemical solution, so as to prevent the bubbles from coalescing on the surface of the substrate; turning on the ultra/mega sonic device and supplying a constant or pulse working power in a second cleaning cycle; turning off the ultra/mega sonic device, and delivering rinse chemical solution or deionized water on the surface of the substrate; drying the substrate.

DETAILED DESCRIPTION

The present invention provides a high temperature chemical solution supply system for cleaning substrates. The system includes a solution tank, a buffer tank, a first pump and a second pump. The solution tank contains high temperature chemical solution. The buffer tank has a tank body, a vent line and a needle valve. The tank body contains the high temperature chemical solution. An end of the vent line connects to the tank body, and the other end of the vent line connects to the solution tank. The needle valve is mounted on the vent line, wherein the needle valve is adjusted to reach a flow rate to vent gas bubbles inside of the high temperature chemical solution out of the buffer tank through the vent line. An inlet of the first pump connects to the solution tank, and an outlet of the first pump connects to the buffer tank. An inlet of the second pump connects to the buffer tank, and an outlet of the second pump connects to a cleaning chamber in which a substrate is cleaned.

The present invention also provides an apparatus for cleaning substrates. The apparatus includes a solution tank, a buffer tank, a first pump, a second pump, a substrate chuck, a rotation driving mechanism, a nozzle, an ultra/mega sonic device and a vertical actuator. The solution tank contains high temperature chemical solution. The buffer tank has a tank body, a vent line and a needle valve. The tank body contains the high temperature chemical solution. An end of the vent line connects to the tank body, and the other end of the vent line connects to the solution tank. The needle valve is mounted on the vent line, wherein the needle valve is adjusted to reach a flow rate to vent gas bubbles inside of the high temperature chemical solution out of the buffer tank through the vent line. An inlet of the first pump connects to the solution tank, and an outlet of the first pump connects to the buffer tank. An inlet of the second pump connects to the buffer tank, and an outlet of the second pump connects to a cleaning chamber in which a substrate is cleaned. The substrate chuck holds the substrate. The rotation driving mechanism connects to the substrate chuck and drives the substrate chuck to rotate. The nozzle delivers the high temperature chemical solution or de-ionized water on the surface of the substrate. The ultra/mega sonic device is positioned adjacent to the substrate and a gap is formed between the substrate and the ultra/mega sonic device. The vertical actuator drives the ultra/mega sonic device to move up or down for changing the gap between the substrate and the ultra/mega sonic device.

Figure 1A:
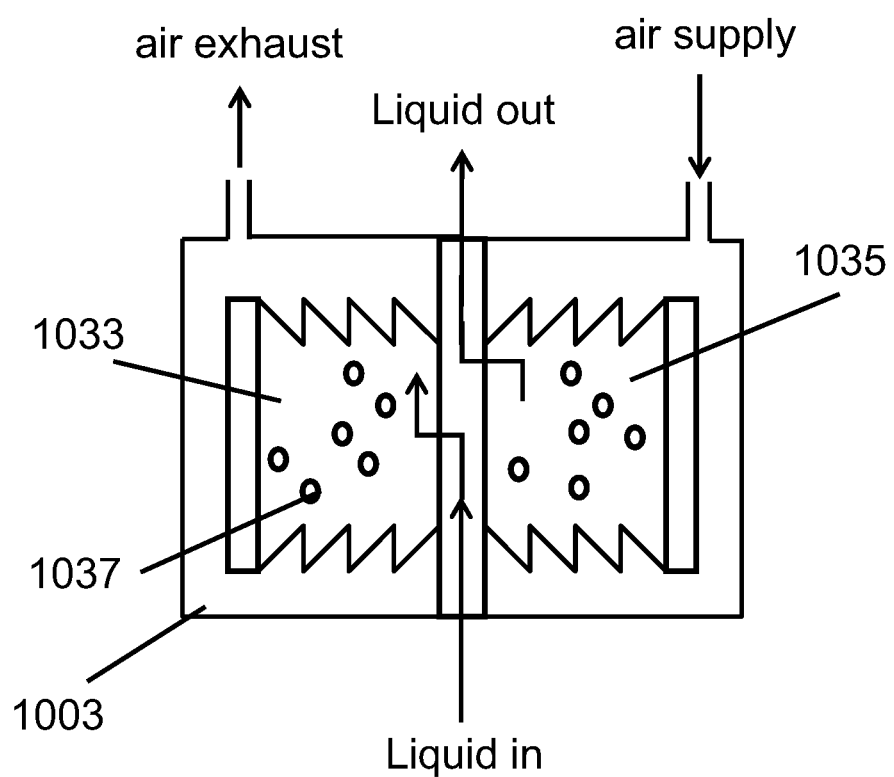
FIGS. 1A-1B depict an exemplary bellow pump working process.
Figure 1B:
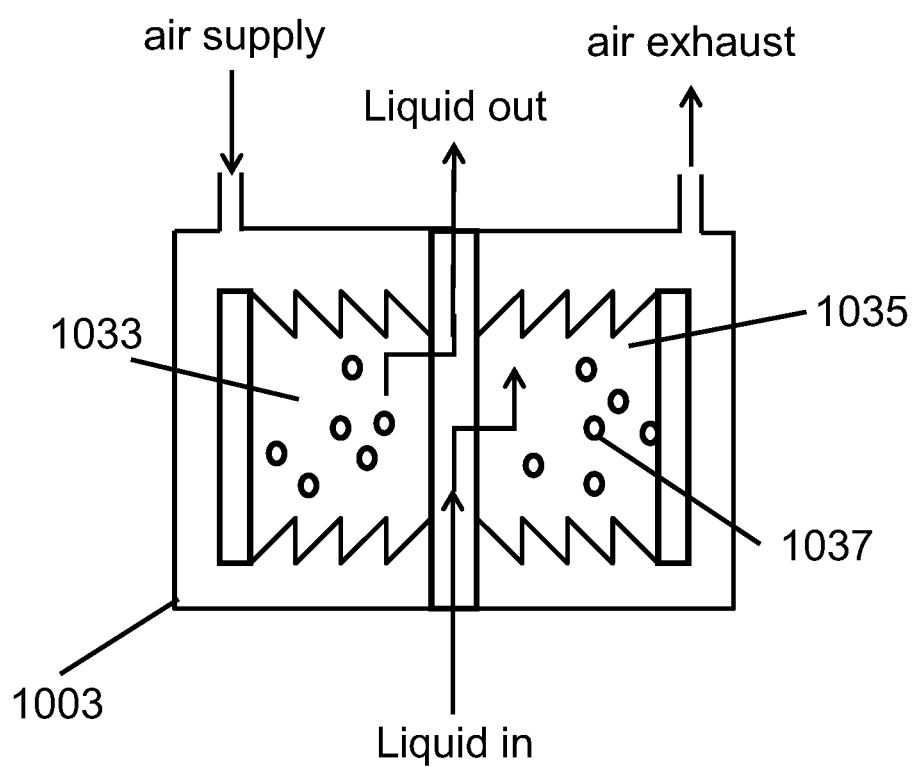

FIGS. 1A to 1B show the mechanism of a conventional bellow pump. The bellow pump 1003 has a left bellow chamber 1033 and a right bellow chamber 1035. As shown in FIG. 1A, when air exhausts, the left bellow chamber 1033 sucks liquid in. When the liquid is chemicals at high temperature, such as SC1 at temperature larger than 70° C., gas bubbles 1037 (mainly oxygen and ammonia gas dissociated from H2O2 and NH4OH) will be generated during such suction process. In the next pump cycle, the gas bubbles 1037 mixed with chemical solution in the left bellow chamber 1033 will be pushed out of the left bellow chamber 1033 when air supplies in, as shown in FIG. 1B. The gas bubbles 1037 will be compressed down to smaller volume. Therefore the pressure of liquid at an outlet of the pump 1003 will be significantly reduced. In addition, the chemical solution mixed with the gas bubbles 1037 will cause miss function of flow meter, heater and ultrasonic device during cleaning process.

Figure 2A:
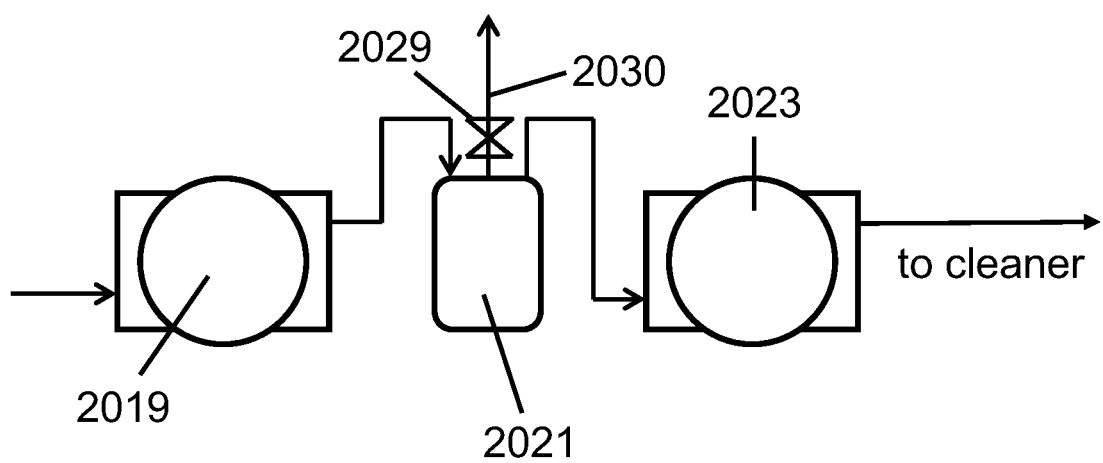
FIGS. 2A-2D depict an exemplary two pump system with a buffer tank.

FIGS. 2A to 2D show one embodiment of pump system in according to the present invention. As shown in FIG. 2A, the pump system includes a first pump 2019, a buffer tank 2021, a second pump 2023, a needle valve 2029 and a vent line 2030. The chemical solution pumped out from the first pump 2019 includes gas bubbles as described above. Those gas bubbles mixed with the chemical solution will be pumped into the buffer tank 2021. In the buffer tank 2021, the gas bubbles will rise up to the top of the buffer tank 2021, and then be vented out through the needle valve 2029 and the vent line 2030. The needle valve 2029 needs to be adjusted enough to vent the most of gas bubbles and at the same time not release too much pressure inside of the buffer tank 2021. The pressure inside the buffer tank 2021 is in the range of 5 psi to 20 psi, and preferred 10 psi, by adjusting the output pressure of the first pump 2019. Then the chemical solution with much less gas bubbles inside the buffer tank 2021 is pressed into the inlet of the second pump 2023. Since the chemical solution pushed into the inlet of the second pump 2023 has a certain pressure (around 10 psi by setting above), the less gas bubbles or few gas bubbles will be generated during the suction process of the second pump 2023. Therefore the pressure at the outlet of the second pump 2023 can be maintained at a high value. The pressure at the outlet of the second pump 2023 can be set as high as 20 to 50 psi. In general, the first pump 2019 can be chosen from either a centrifugal type of pump or a bellow type of pump. The Second pump 2023 is preferred to use a bellow type of pump to get a higher pressure output.

Figures 2B, 2C, 2D:
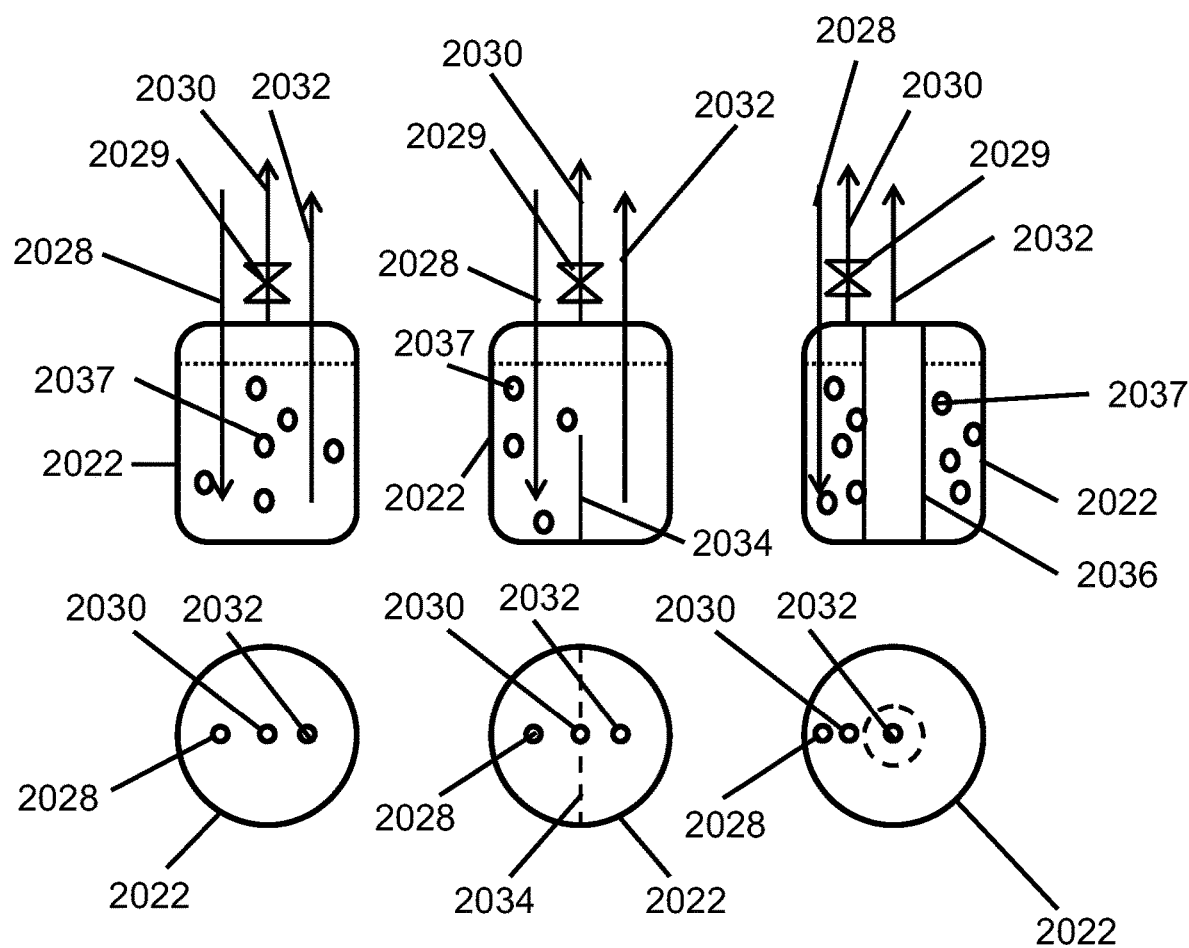

FIG. 2B shows one embodiment of the buffer tank in according to the present invention. The buffer tank has a tank body 2022, an inlet tube 2028, a needle valve 2029, a vent line 2030 and an outlet tube 2032. The inlet tube 2028 and the outlet tube 2032 are inserted into a position close to the bottom of the tank body 2022, and the vent line 2030 is mounted on the top of the buffer tank 2021. The gas bubbles 2037 in the chemical solution will rise up and be vented out of the buffer tank 2021 through the vent line 2030.

FIG. 2C shows another embodiment of the buffer tank in according to the present invention. The buffer tank is similar to that shown in FIG. 2B, except that the buffer tank 2021 further includes a bubble divider 2034. The function of the bubble divider 2034 is to prevent the gas bubbles 2037 output from the inlet tube 2028 from getting into the outlet tube 2032. The height of the bubble divider 2034 is in the range of 50% to 80% of the height of the buffer tank, and preferred 70%.

FIG. 2D shows another embodiment of the buffer tank in according to the present invention. The buffer tank is similar to that shown in FIG. 2B, except that the buffer tank 2021 further includes a particle filter 2036, and that the outlet tube 2032 is mounted on the top of the buffer tank 2021 and at the outlet of the particle filter 2036. The inlet tube 2028 is inserted into a position close to the bottom of the tank body 2022 and at an inlet of the particle filter 2036. The outlet tube 2032 is mounted on the top of the buffer tank 2021 and at an outlet of the particle filter 2036. The vent line 2030 is mounted on the top of the buffer tank 2021 and at the inlet of the particle filter 2036. The function of the particle filter 2036 is to prevent the gas bubbles 2037 from going directly to the outlet tube 2032 by the filter membrane. The gas bubbles 2037 stopped by the filter membrane is vented through the vent line 2030 and the needle valve 2029.

Figure 3:
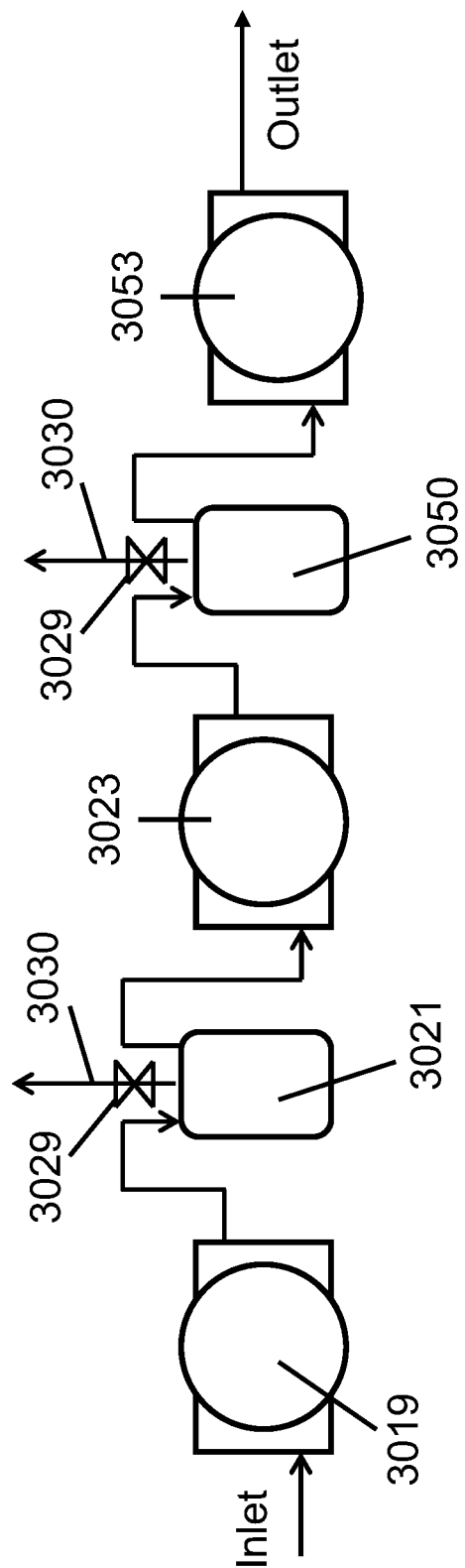
FIG. 3 depicts an exemplary three pump system with two buffer tanks.

FIG. 3 shows another embodiment of pump system in according to the present invention. The pump system is similar to that shown in FIG. 2A, except that the pump system further includes a second buffer tank 3050 and a fourth pump 3053. The three pump system can generate the higher pressure and larger flow rate of chemicals at higher temperature than two pump system does. Obviously, more pumps and buffer tanks can be combined to reach an even higher pressure and larger flow rate.

Figure 4:
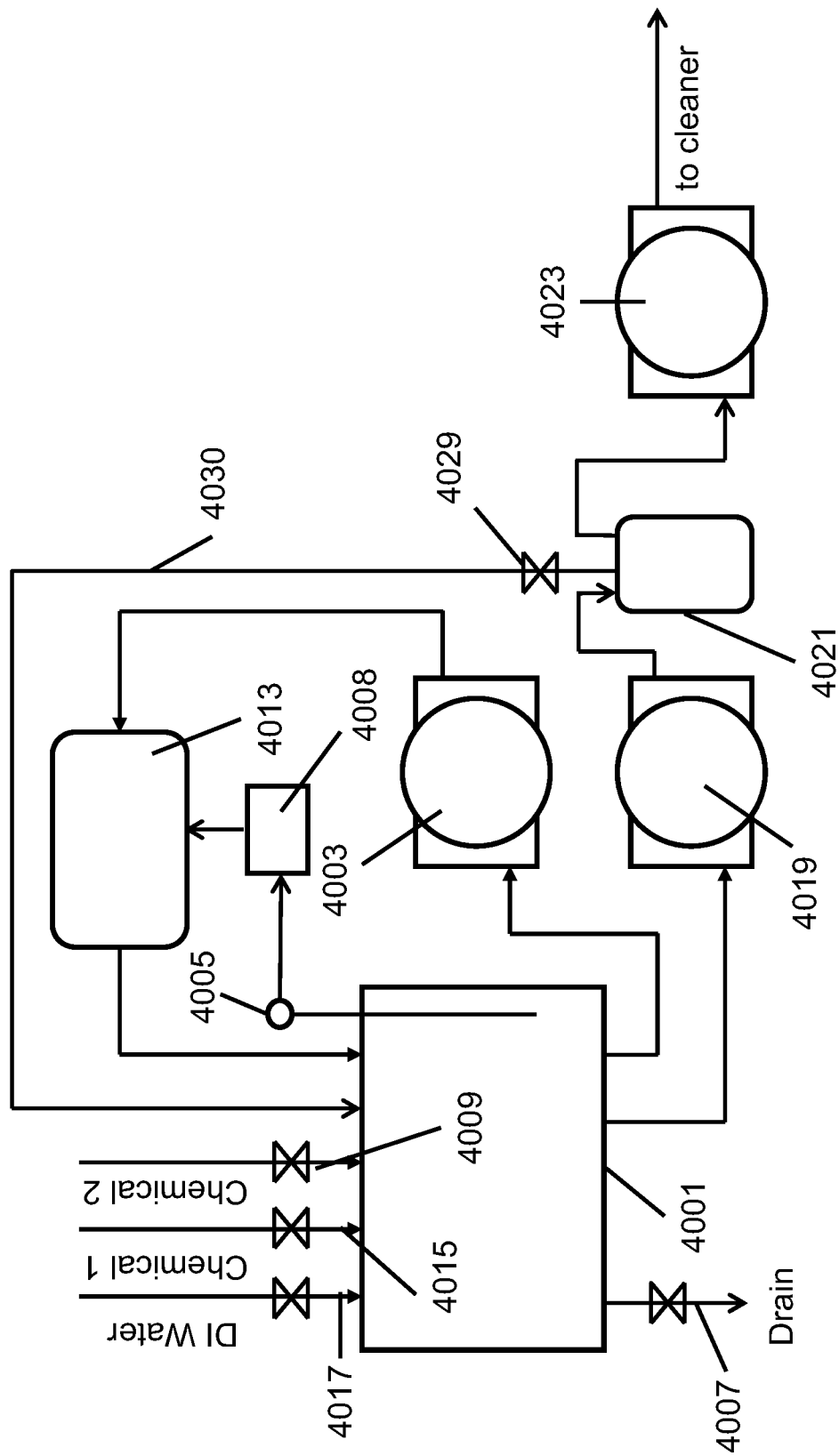
FIG. 4 depicts an exemplary high temperature chemical blending, heating and delivering system.

FIG. 4 shows one embodiment of hot chemical solution supply system in according to the present invention. The embodiment includes a solution tank 4001, a first pump 4019, a buffer tank 4021, a second pump 4023, a third pump 4003, a heater 4013, a thermometer 4005 and a controller 4008. The solution tank 4001 has a first inlet 4017 for inputting water, a second inlet 4015 for inputting a first chemical such as $H_2O_2$, and a third inlet 4009 for inputting a second chemical such as $NH_4OH$. The solution tank 4001 further has a drain line 4007 for draining the chemical solution out of the solution tank 4001. The outside surface of the solution tank 4001 is covered by thermal isolation material such as rubber or plastic foam in order to preserve the heat. Also all liquid tubes or lines connected among the solution tank 4001, the first pump 4019, the buffer tank 4021, the second pump 4023, the third pump 4003, and the heater 4013 are covered by the same thermal insulation material. The hot chemical solution supply system works as follows:

Step 1. Fill water (deionized water) into the solution tank 4001 to required amount. In order to short the heat up time, the hot water with temperature set as 60° C. can be filled if the temperature of the final blended chemical solution needs to be larger than 60° C.;

Step 2. Fill a first chemical such as $H_2O_2$ in according to the required concentration;

Step 3. Fill a second chemical such as $NH_4OH$ in according to the required concentration;

Step 4. Turn on the third pump 4003 with air pressure set at range of 20 to 60 psi, preferred 40 psi;

Step 5. Turn on the heater 4013 with temperature set at T0 as required, the temperature can be set in the range of 35° C. to 95° C.;

Step 6. When the temperature of the chemical solution in the solution tank 4001 read from the thermometer 4005 reaches the set temperature T0, then turn on the first pump 4019 at output pressure P1 setting in the range of 5 to 30 psi, preferred 15 psi;

Step 7. Adjust the needle valve 4029 to reach a flow rate only enough to vent out gas bubbles. Vented gas bubbles mixed with blended chemical solution such as SC1 will be return back to the solution tank 4001 through the vent line 4030 in order to save chemicals;

Step 8. Turn on the second pump 4023 at output pressure P2 setting in the range of 10 to 80 psi, the P2 should be larger than P1;

Step 9. Readjust the needle valve 4029 to reach a certain flow rate only enough to vent out gas bubbles, since the variation of pressure P1 may affect the flow rate of the vent line 4030 due to the second pump 4023 turn on.

Figure 5A:
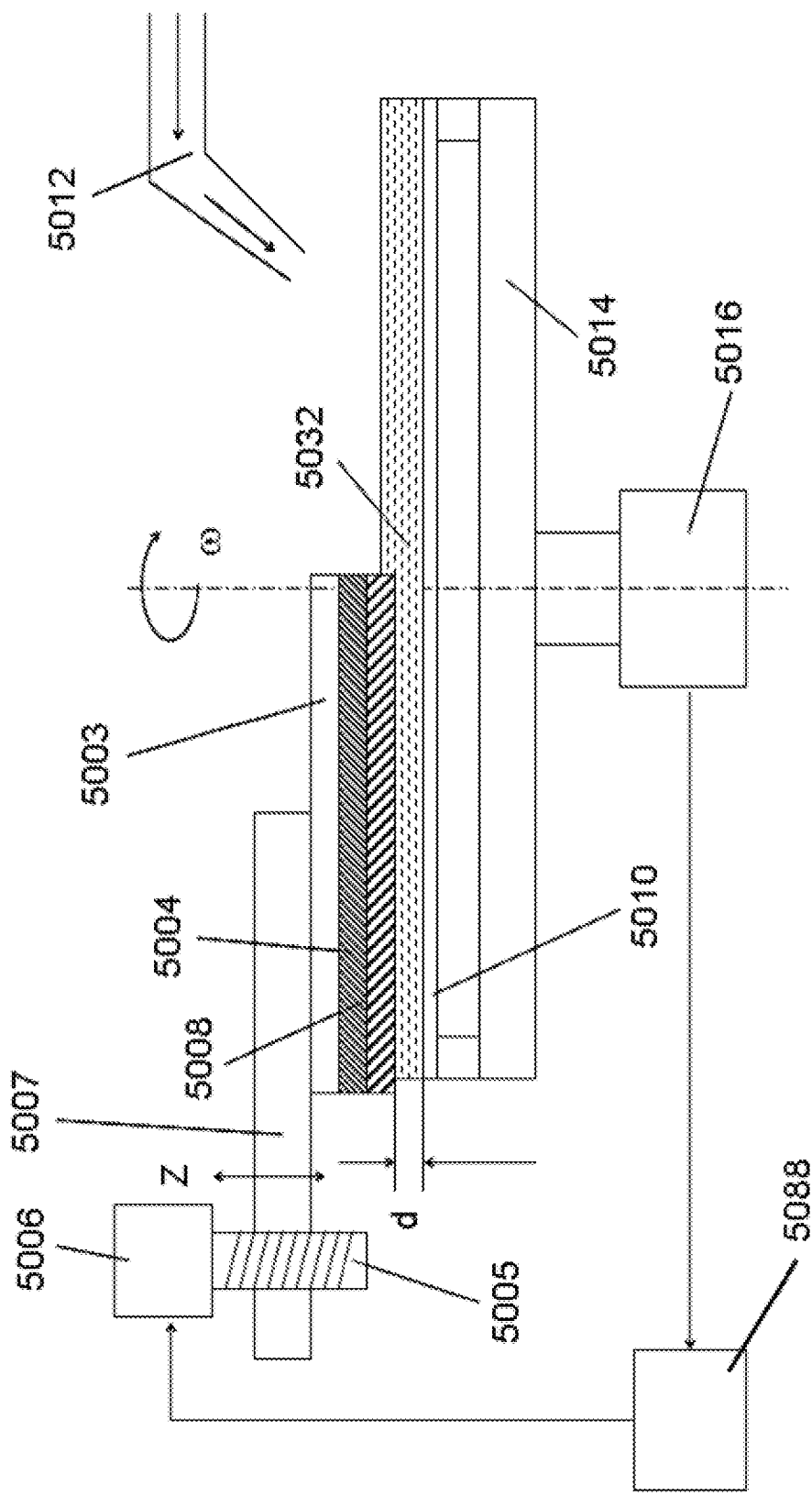
FIGS. 5A-5B depict an exemplary substrate cleaning apparatus having an ultra or mega sonic device for cleaning a substrate.
Figure 5B:
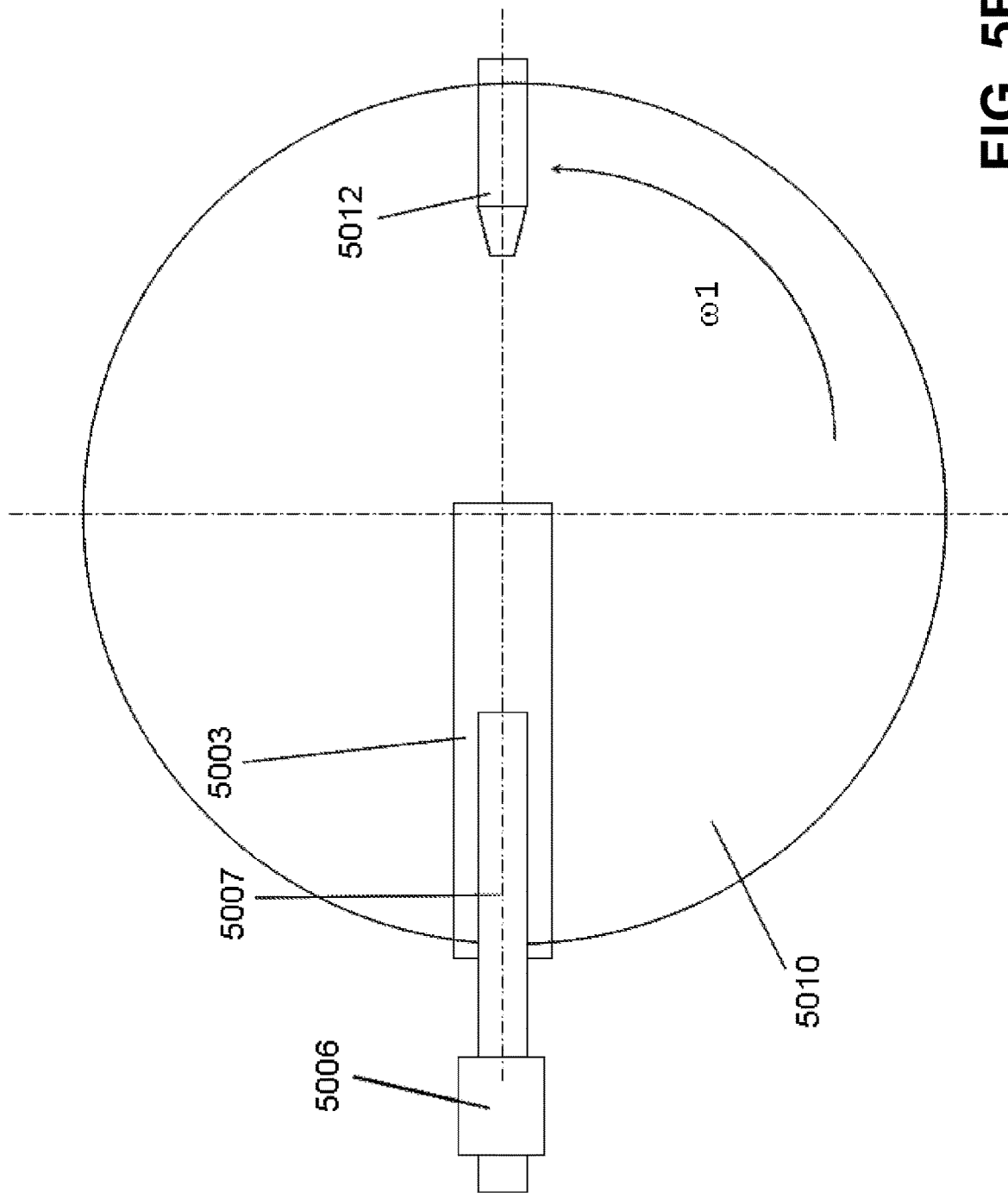

FIGS. 5A to 5B depict an exemplary substrate cleaning apparatus having an ultra or mega sonic device for cleaning a substrate. The substrate cleaning apparatus includes a substrate 5010, a substrate chuck 5014 being rotated by a rotation driving mechanism 5016, a nozzle 5012 delivering chemical solution or de-ionized water 5032, and an ultra or mega sonic (ultrasonic running at MHZ frequency) device 5003. The ultra or mega sonic device 5003 further includes a piezoelectric transducer 5004 acoustically coupled to a resonator 5008. The transducer 5004 is electrically excited such that it vibrates and the resonator 5008 transmits high frequency sound energy into the chemical solution or de-ionized water 5032. The agitation of the cavitation produced by the mega sonic energy loosens particles on the substrate 5010. Contaminants are thus vibrated away from the surfaces of the substrate 5010, and removed from the surfaces of the substrate 5010 through the flowing chemical solution or de-ionized water 5032 supplied by the nozzle 5012.

The substrate cleaning apparatus further includes a support beam 5007, a lead screw 5005 and a vertical actuator 5006. The gap d between the ultra or mega sonic device 5003 and the substrate 5010 is increased or reduced by the lead screw 5005 and the vertical actuator 5006 as the substrate chuck 5014 rotating during cleaning process. A control unit 5088 is used to control the speed of the vertical actuator 5006 based on the speed of the rotation driving mechanism 5016.

In one embodiment, controlling the gap d is applied for releasing the bubbles coalesced under or around the ultra or mega sonic device 5003. The gap d between the ultra or mega sonic device 5003 and the surface of the substrate 5010 is high enough so that the ultra or mega sonic device 5003 working surface is not immersed in the cleaning chemical solution 5032.

With ultra or mega sonic wave input to the gap between the substrate 5010 and the ultra or mega sonic device 5003, the hot chemical solution such as SC1 with temperature above 70° C. will generate gas bubbles, which will increase the reflection power back to the ultra or mega sonic device and cause the ultra or mega sonic power shut down, at the same time the less power of ultra or mega sonic power in the gap will reduce cleaning effect on the substrate 5010. Furthermore, the gas bubbles trapped on the surface of the substrate 5010 may block the chemical solution and ultra or mega sonic wave touching the substrate 5010, which will introduce no cleaning portion or defect on the substrate 5010.

In order to reduce the gas bubbles generated during ultra or mega sonic assisted cleaning process, the cleaning process is divided into a few phases to reduce the gas bubbles. The detail method in accordance to the present invention is described as follows:

Step 1: The substrate 5010 is rotated by the substrate chuck 5014 at a rotation speed set in the range of 300-1200 rpm, preferred 500 rpm.

Step 2: Deionized water through the nozzle 5012 is delivered on the surface of the substrate 5010 for pre wetting the surface of the substrate 5010.

Step 3: Chemical solution such as SC1 with high temperature (larger than 70° C.) is delivered by the nozzle 5012 on the surface of the substrate 5010 for cleaning the surface of the substrate 5010.

Step 4: Substrate rotation speed is changed to a low speed (10-200 rpm), and an ultra or mega sonic device is moved close to the surface of the substrate 5010 with a gap d formed between the ultra or mega sonic device 5003 and the surface of the substrate 5010. The chemical solution is fully filled in the gap d between the ultra or mega sonic device 5003 and the surface of the substrate 5010, in this case, the working surface of the ultra or mega sonic device 5003 is immersed in the chemical solution.

Step 5: Turn on the ultra or mega sonic device 5003 and supply a constant or pulse working power in a FIRST CLEANING CYCLE, while the gap d is controlled by the vertical actuator 5006 during this step.

The waveform of the ultra or mega sonic power is programmable and pre-set by recipe and the profile of gap d changing is programmable and pre-set by recipe.

Step 6: Turn off the ultra or mega sonic device. A high temperature chemical solution or deionized water is delivered on the surface of the substrate 5010 for releasing the gas bubbles generated by the ultra or mega sonic device during step 5, so as to prevent the gas bubbles from coalescing on the surface of the substrate.

During this BUBBLE RELEASING step, the delivering chemical solution can be the same type as the cleaning chemical solution or different type from the cleaning chemical solution.

The delivering chemical solution is fully filled in the gap d between the ultra or mega sonic device and the surface of the substrate, in this case, the ultra or mega sonic device working surface is immersed in the cleaning chemical solution.

The substrate rotation speed can be set at higher value for better bubble releasing.

The gap d can be set at a larger value for better bubble releasing.

The ultra or mega sonic device supplying power can be set at a lower value or completely turn off for better bubble releasing.

The time of this BUBBLE RELEASING step can be set at a few seconds due to the throughput concerns.

Step 7: Turn on the ultra or mega sonic device 5003 and supply a constant or pulse working power in a SECOND CLEANING CYCLE, while the gap d is controlled by the vertical actuator during this step.

The waveform of the ultra or mega sonic power is programmable and pre-set by recipe and the profile of gap d changing is programmable and pre-set by recipe.

The step 6 to step 7 can be continuously applied as a multiple cycles cleaning, so as to enhancing the cleaning performance.

The first cleaning cycle and the second cleaning cycle are repeated a plurality of times, and one bubble releasing step is set between every two cleaning cycles. The first cleaning cycle and the second cleaning cycle are the same or different.

Step 8: Turn off the ultra or mega sonic device 5003, and delivering rinse chemical solution or deionized water through the nozzle 5012 on the substrate 5010.

Step 9: Dry the substrate 5010.

Another method to prevent gas bubbles generated during ultra or mega sonic assisted cleaning process in accordance to the present invention is disclosed as follows:

Step 1: The substrate 5010 is rotated by the substrate chuck 5014 at rotation speed set in the range of 300-1200 rpm, preferred 500 rpm.

Step 2: Deionized water through the nozzle 5012 is delivered on the surface of the substrate 5010 for pre wetting the surface of the substrate 5010.

Step 3: Chemical solution such as SC1 with high temperature (larger than 70° C.) is delivered by the nozzle 5012 on the surface of the substrate 5010 for cleaning the surface of the substrate 5010.

Step 4: Substrate rotation speed is changed to a low speed (10-200 rpm), and an ultra or mega sonic device 5003 is moved close to the surface of the substrate 5010 with a gap d formed between the ultra or mega sonic device and the surface of the substrate. The chemical solution is fully filled in the gap d between the ultra or mega sonic device 5003 and the surface of the substrate 5010, in this case, the ultra or mega sonic device working surface is immersed in the chemical solution.

Step 5: Turn on the ultra or mega sonic device 5003 and supply a constant or pulse working power in a FIRST CLEANING CYCLE, while the gap d is controlled by the vertical actuator 5006 during this step.

The waveform of the ultra or mega sonic power is programmable and pre-set by recipe and the profile of gap d changing is programmable and pre-set by recipe.

Step 6: Turn off the ultra or mega sonic device, and then raise up the ultra or mega sonic device out of the high temperature chemical solution surface for releasing gas bubbles coalesced under or around the ultra or mega sonic device.

During this BUBBLE RELEASING step, the delivering chemical solution can be the same type as the cleaning chemical solution or different type from the cleaning chemical solution.

The ultra or mega sonic device is raised up and the gap d between the ultra or mega sonic device and the surface of the substrate is high enough so that the ultra or mega sonic device working surface is not immersed in the cleaning chemical solution.

The substrate rotation speed can be set at a higher value for better bubble releasing.

The ultra or mega sonic device supplying power can be set at a lower value or turn off for better bubble releasing.

The time of this BUBBLE RELEASING step can be set at a few seconds due to the throughput concerns.

Step 7: Move the ultra or mega sonic device 5003 down a gap d with the substrate 5010, and then turn on the ultra or mega sonic device 5003 and supply a constant or pulse working power in a SECOND CLEANING CYCLE, while the gap d is controlled by the vertical actuator 5006 during this step.

The waveform of the ultra or mega sonic power is programmable and pre-set by recipe and the profile of gap d changing is programmable and pre-set by recipe.

The step 6 to step 7 can be continuously applied as a multiple cycles cleaning, so as to enhancing the cleaning performance.

The first cleaning cycle and the second cleaning cycle are repeated a plurality of times, and one bubble releasing step is set between every two cleaning cycles. The first cleaning cycle and the second cleaning cycle are the same or different.

Step 8: Turn off the ultra or mega sonic device 5003, and delivering rinse chemical solution or deionized water on the substrate 5010.

Step 9: Dry the substrate 5010.

Further another method to prevent gas bubbles generated during ultra or mega sonic assisted cleaning process in accordance to the present invention is disclosed as follows:

Step 1: The substrate 5010 is rotated by the substrate chuck 5014 at rotation speed set in the range of 300-1200 rpm, preferred 500 rpm.

Step 2: Deionized water through the nozzle 5012 is delivered on the surface of the substrate 5010 for pre wetting the surface of the substrate 5010.

Step 3: One type of HIGH TEMPERATURE chemical solution or deionized water is delivered on the surface of the substrate 5010 for cleaning the surface of the substrate 5010 by a scanning nozzle, and the scanning profile can be programmable and set by recipe.

Step 4: One type of MEDIUM TEMPERATURE chemical solution (25° C.-70° C.) or deionized water is delivered on the surface of the substrate 5010 for cleaning the surface of the substrate 5010.

The MEDIUM TEMPERATURE chemical solution can be the same type as the high temperature chemical solution or different type from the high temperature chemical solution.

Step 5: Substrate rotation speed is changed to a low RPM (10-500RPM), and an ultra or mega sonic device is applied on the surface of the substrate with a gap d formed between the ultra or mega sonic device and the surface of the substrate, co-working with the MEDIUM TEMPERATURE chemical solution. The cleaning chemical solution is fully filled in the gap d between the ultra or mega sonic device and the surface of the substrate, in this case, the ultra or mega sonic device working surface is immersed in the cleaning chemical solution.

Step 6: Turn on the ultra or mega sonic device and supply a constant or pulse working power in a FIRST CLEANING CYCLE, while the gap d is controlled by the vertical actuator during this step.

The waveform of the ultra or mega sonic power is programmable and pre-set by recipe and the profile of gap d changing is programmable and pre-set by recipe.

Step 7: A MEDIUM TEMPERATURE chemical solution or deionized water is delivered on the surface of the substrate for releasing gas bubbles generated by the MEDIUM TEMPERATURE chemical solution, so as to prevent the gas bubbles coalesced on the surface of the substrate.

During this BUBBLE RELEASING step, the delivering chemical solution can be the same type as the cleaning chemical solution or different type from the cleaning chemical solution.

The substrate rotation speed can be set at a higher value for better bubble releasing.

The gap d can be set at a larger value for better bubble releasing.

The ultra or mega sonic device supplying power can be set at a lower value or turn off for better bubble releasing.

The time of this BUBBLE RELEASING step can be set at a few seconds due to the throughput concerns.

Step 8: Turn on the ultra or mega sonic device and supply a constant or pulse working power in a SECOND CLEANING CYCLE, while the gap d is controlled by the vertical actuator during this step.

The waveform of the ultra or mega sonic power is programmable and pre-set by recipe and the profile of gap d changing is programmable and pre-set by recipe.

The step 7 to step 8 can be continuously applied as a multiple cycles cleaning, so as to enhancing the cleaning performance.

The first cleaning cycle and the second cleaning cycle are repeated a plurality of times, and one bubble releasing step is set between every two cleaning cycles. The first cleaning cycle and the second cleaning cycle are the same or different.

Step 9: Turn off the ultra or mega sonic device, and delivering rinse chemical solution or deionized water on the substrate.

Step 10: Dry the substrate.

What is claimed is:

1. A method for cleaning substrates, comprising:
    rotating a substrate;
    delivering deionized water on a surface of the substrate for pre wetting the surface of the substrate;
    delivering chemical solution with high temperature on the surface of the substrate for cleaning the surface of the substrate;
    changing the rotation speed of the substrate to a low rotation speed, and moving a ultra/mega sonic device close to the surface of the substrate with a gap d between the ultra/mega sonic device and the surface of the substrate, wherein the high temperature chemical solution is fully filled in the gap d;
    turning on the ultra/mega sonic device and supplying a constant or pulse working power in a first cleaning cycle;
    turning off the ultra/mega sonic device, and raising up the ultra/mega sonic device out of the high temperature chemical solution surface for releasing bubbles coalesced under or around the ultra/mega sonic device;
    moving the ultra/mega sonic device down with a gap d between the ultra/mega sonic device and the surface of the substrate, and then turning on the ultra/mega sonic device and supplying a constant or pulse working power in a second cleaning cycle;
    turning off the ultra/mega sonic device, and delivering rinse chemical solution deionized water on the surface of the substrate;
    drying the substrate.

2. The method according to claim 1, wherein the ultra/mega sonic device is raised up and the gap d between the ultra/mega sonic device and the surface of the substrate is controlled to make the ultra/mega sonic device working surface is not immersed in the cleaning chemical solution.

3. The method according to claim 1, wherein the first cleaning cycle and the second cleaning cycle are repeated a plurality of times, and one bubble releasing step is set between every two cleaning cycles.

4. The method according to claim 3, wherein the first cleaning cycle and the second cleaning cycle are the same.

5. The method according to claim 3, wherein the first cleaning cycle and the second cleaning cycle are different.

* * * * *